United States Patent
Sun (10) Patent No.: US 12,289,113 B2
(45) Date of Patent: Apr. 29, 2025

(54) DELAY LOCKED LOOP

(71) Applicant: Winbond Electronics Corp., Taichung (TW)

(72) Inventor: Chi-Hsiang Sun, Taichung (TW)

(73) Assignee: Windbond Electronics Corp., Taichung (TW)

( * ) Notice: Subject to any disclaimer, the term of this patent is extended or adjusted under 35 U.S.C. 154(b) by 258 days.

(21) Appl. No.: 18/311,251

(22) Filed: May 3, 2023

(65) Prior Publication Data

US 2024/0340013 A1 Oct. 10, 2024

(30) Foreign Application Priority Data

Apr. 6, 2023 (TW) .................................. 112112802

(51) Int. Cl.
*H03L 7/081* (2006.01)
*G11C 19/00* (2006.01)
*H03L 7/091* (2006.01)
*H03K 19/20* (2006.01)

(52) U.S. Cl.
CPC ............ *H03L 7/0812* (2013.01); *G11C 19/00* (2013.01); *H03L 7/091* (2013.01); *H03K 19/20* (2013.01)

(58) Field of Classification Search
CPC ....... H03L 7/0812; H03L 7/091; G11C 19/00; H03K 19/20
See application file for complete search history.

(56) References Cited

U.S. PATENT DOCUMENTS

| | | | |
|---|---|---|---|
| 6,906,566 B2 * | 6/2005 | Drexler ................... | H03L 7/087 327/158 |
| 6,943,602 B1 * | 9/2005 | Lee ........................ | H03L 7/0814 327/158 |
| 7,327,175 B2 * | 2/2008 | Lee ........................ | H03L 7/0814 327/158 |
| 7,375,565 B2 * | 5/2008 | Kwak .................... | H03L 7/087 327/158 |

(Continued)

FOREIGN PATENT DOCUMENTS

| | | | | |
|---|---|---|---|---|
| DE | 102020200289 A1 * | 7/2021 | ............. | H03L 7/089 |
| WO | WO-2010031279 A1 * | 3/2010 | ........... | H03L 7/0805 |

OTHER PUBLICATIONS

"Office Action of Taiwan Counterpart Application", issued on Mar. 1, 2024, p. 1-p. 6.

*Primary Examiner* — Adam D Houston
(74) *Attorney, Agent, or Firm* — JCIPRNET (57) ABSTRACT

A delay locked loop includes a delay line, a phase detector, a controller, an output clock generator, and a feedback circuit. The delay line receives an input clock signal and a control code, and generates a delayed clock signal by delaying the input clock signal according to the control code. The phase detector receives a reference clock signal and a feedback clock signal, and detects a phase difference between the reference clock signal and the feedback clock signal to generate phase comparison information. The controller generates the control code and a switching signal according to the phase comparison information. The output clock generator selects the delayed clock signal or an inverted signal of the delayed clock signal according to the switching signal to generate an output clock signal. The feedback circuit generates the feedback clock signal according to the output clock signal.

13 Claims, 9 Drawing Sheets

(56) References Cited

U.S. PATENT DOCUMENTS

| | | | | |
|---|---|---|---|---|
| 7,741,891 B2* | 6/2010 | Kim | ............... | H03L 7/0814 |
| | | | | 327/158 |
| 7,778,095 B2* | 8/2010 | Na | ............... | G11C 7/22 |
| | | | | 365/194 |
| 7,834,664 B2* | 11/2010 | Yoon | ............... | G06F 1/08 |
| | | | | 327/144 |
| 10,979,057 B1 | 4/2021 | Sun et al. | | |
| 11,677,403 B1* | 6/2023 | Yang | ............... | H03L 7/091 |
| | | | | 327/158 |
| 11,909,404 B1* | 2/2024 | Chu | ............... | H03L 7/189 |
| 2001/0005337 A1* | 6/2001 | Jung | ............... | G11C 7/22 |
| | | | | 365/230.08 |
| 2003/0197536 A1* | 10/2003 | Issa | ............... | H03L 7/16 |
| | | | | 327/158 |
| 2005/0195663 A1* | 9/2005 | Kwak | ............... | H03L 7/087 |
| | | | | 365/194 |
| 2008/0211555 A1* | 9/2008 | Kwak | ............... | G11C 7/1072 |
| | | | | 327/158 |
| 2009/0045857 A1* | 2/2009 | Kim | ............... | H03L 7/0816 |
| | | | | 327/158 |
| 2015/0372690 A1* | 12/2015 | Tertinek | ............... | H03M 1/08 |
| | | | | 327/159 |
| 2021/0250030 A1* | 8/2021 | Abuellil | ............... | H03L 7/0814 |
| 2021/0335403 A1* | 10/2021 | Choi | ............... | G11C 7/1057 |
| 2022/0343965 A1 | 10/2022 | Choi et al. | | |
| 2023/0308103 A1* | 9/2023 | Han | ............... | H03K 5/134 |
| 2024/0340013 A1* | 10/2024 | Sun | ............... | H03L 7/0814 |

\* cited by examiner

DELAY LOCKED LOOP

CROSS-REFERENCE TO RELATED APPLICATION

This application claims the priority benefit of Taiwanese application no. 112112802, filed on Apr. 6, 2023. The entirety of the above-mentioned patent application is hereby incorporated by reference herein and made a part of this specification.

BACKGROUND

Technical Field

The disclosure relates to a delay locked loop, and particularly relates to a delay locked loop capable of mitigating stuck locking.

Description of Related Art

Along with advancement of electronic technology, electronic devices have become essential tools in people's lives. Due to the popularization of electronic devices, the electronic devices typically need to operate in a state where an ambient temperature changes drastically. In such a case, in a delay locked loop of an electronic product, even if a delay line provides a minimum delay amount, a phase locking action cannot be achieved, and stuck locking is caused in the delay locked loop.

SUMMARY

The disclosure is directed to a delay locked loop, which mitigates stuck locking.

The disclosure provides a delay locked loop including a delay line, a phase detector, a controller, an output clock generator, and a feedback circuit. The delay line receives an input clock signal and a control code, and generates a delayed clock signal by delaying the input clock signal according to the control code. The phase detector receives a reference clock signal and a feedback clock signal, and detects a phase difference between the reference clock signal and the feedback clock signal to generate phase comparison information. The controller is coupled to the delay line and the phase detector, and generates the control code and a switching signal according to the phase comparison information. The output clock generator is coupled to the delay line and the controller, and selects the delayed clock signal or an inverted signal of the delayed clock signal according to the switching signal to generate an output clock signal. The feedback circuit is coupled to the phase detector and the output clock generator, and generates the feedback clock signal according to the output clock signal.

Based on the above description, the delay locked loop of the disclosure obtains the phase difference between the reference clock signal and the feedback clock signal, and selects the inverted signal of the delayed clock signal to serve as a basis for delay locking when a phase of the feedback clock signal lags too much behind a phase of the reference clock signal. In this way, a phase locking action of the delay locked loop may be effectively performed, and the likelihood of stuck locking may be prevented.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
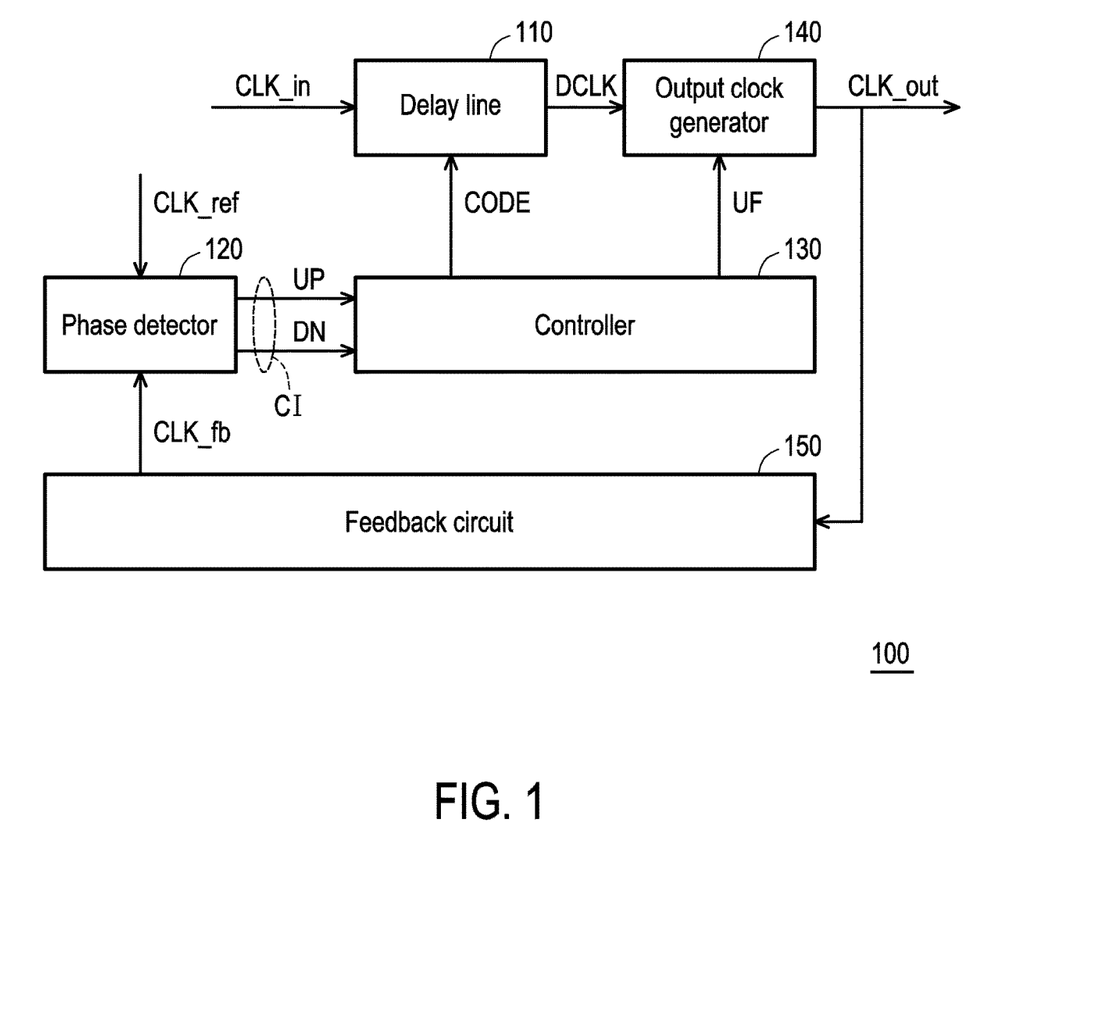
FIG. 1 is a schematic diagram of a delay locked loop according to an embodiment of the disclosure.

Referring to FIG. 1, FIG. 1 is a schematic diagram of a delay locked loop according to an embodiment of the disclosure. A delay locked loop 100 includes a delay line 110, a phase detector 120, a controller 130, an output clock generator 140 and a feedback circuit 150. The delay line 110 receives an input clock signal CLK_in and a control code CODE. The delay line 110 delays the input clock signal CLK_in according to the control code CODE to generate a delayed clock signal DCLK. The phase detector 120 receives a reference clock signal CLK_ref and a feedback clock signal CLK_fb. The phase detector 120 detects a phase difference between the reference clock signal CLK_ref and the feedback clock signal CLK_fb to generate phase comparison information CI. Where, the phase comparison information CI includes signals UP and DN. The signals UP and DN are used to indicate whether the phase of the reference clock signal CLK_ref is ahead of or behind the phase of the feedback clock signal CLK_fb.

The controller 130 is coupled to the delay line 110 and the phase detector 120. The controller 130 receives the phase comparison information CI generated by the phase detector 120, and generates the control code CODE and a switching signal UF according to the phase comparison information CI. Where, the controller 130 may control a delay amount provided by the delay line 110 by generating the control code CODE, so as to adjust a phase difference between the delayed clock signal DCLK and the input clock signal CLK_in. The controller 130 may further generate the switching signal UF according to a lagging degree of the phase of the feedback clock signal CLK_fb lagging behind the phase of the reference clock signal CLK_ref. In detail, if the lagging degree of the phase of the feedback clock signal CLK_fb lagging behind the phase of the reference clock signal CLK_ref is more than a predetermined threshold, the controller 130 may set the switching signal UF to a first voltage. Comparatively, if the lagging degree of the phase of the feedback clock signal CLK_fb lagging behind the phase of the reference clock signal CLK_ref is no more than the above predetermined threshold, the controller 130 may set the switching signal UF to a second voltage. Where, the first voltage is different from the second voltage, for example, the first voltage may be a first logic voltage, and the second voltage may be a second logic voltage.

In an embodiment of the disclosure, in an actual operation, the controller 130 may determine whether the phase of the feedback clock signal CLK_fb lags behind the phase of the reference clock signal CLK_ref according to the phase comparison information CI. When the controller 130 determines that the phase of the feedback clock signal CLK_fb lags behind the phase of the reference clock signal CLK_ref, the controller 130 may reduce a delay value provided by the delay line 110 by adjusting the control code CODE, so that the phase of the feedback clock signal CLK_fb and the phase of the reference clock signal CLK_ref are close to each other. When the controller 130 reduces the delay value provided by the delay line 110 to a minimum value through the control code CODE, if the phase comparison information CI indicates that the phase of the feedback clock signal CLK_fb still lags behind the phase of the reference clock signal CLK_ref, the controller 130 may change the switching signal UF from the second voltage to the first voltage.

The output clock generator 140 is coupled to the delay line 110 and the controller 130. The output clock generator 140 receives the delayed clock signal DCLK and the switching signal UF. The output clock generator 140 is configured to select the delayed clock signal DCLK or the inverted signal of the delayed clock signal DCLK according to the switching signal UF to generate an output clock signal CLK_out. In detail, when the switching signal UF is at the first voltage, the output clock generator 140 selects the inverted signal of the delayed clock signal DCLK according to the switching signal UF to generate the output clock signal CLK_out; comparatively, when the switching signal UF is at the second voltage, the output clock generator 140 selects the delayed clock signal DCLK according to the switching signal UF to generate the output clock signal CLK_out.

In addition, the feedback circuit 150 is coupled between the output clock generator 140 and the phase detector 120. The feedback circuit 150 generates the feedback clock signal CLK_fb according to the output clock signal CLK_out. In the embodiment, the feedback circuit 150 may be constructed by a buffer.

In the embodiment, when the phase difference between the phase of the feedback clock signal CLK_fb and the phase of the reference clock signal CLK_ref is within a certain range, the controller 130 may adjust the delay amount provided by the delay line 110 by adjusting the control code CODE, so that the phase of the feedback clock signal CLK_fb and the phase of the reference clock signal CLK_ref may be mutually locked.

When the phase difference between the phase of the feedback clock signal CLK_fb and the phase of the reference clock signal CLK_ref is too large, the output clock generator 140 may select the inverted signal of the delayed clock signal DCLK to generate the output clock signal CLK_out, so that the phase of the feedback clock signal CLK_fb generated by the feedback circuit 150 may be advanced by 180 degrees. In this way, according to the range of the delay value provided by the delay line 110, the phase of the feedback clock signal CLK_fb and the phase of the reference clock signal CLK_ref may be locked with each other. Therefore, the controller 130 may provide the appropriate control code CODE to make the phases of the feedback clock signal CLK_fb and the reference clock signal CLK_ref to be locked each other, so as to effectively prevent stuck locking.

Figure 2A:
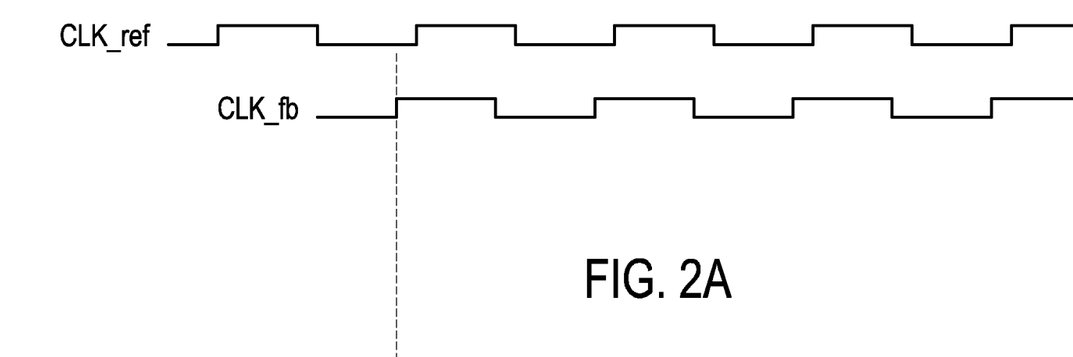
FIG. 2A to FIG. 2F are waveform diagrams of a delay locked loop according to an embodiment of the disclosure.
Figure 2B:
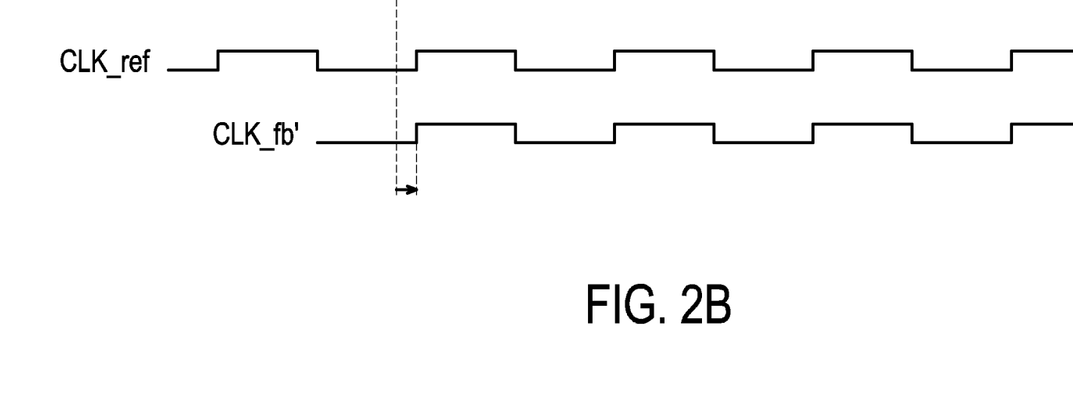

Referring to FIG. 1 and FIG. 2A to FIG. 2F synchronously, where FIG. 2A to FIG. 2F are waveform diagrams of the delay locked loop according to an embodiment of the disclosure. In FIG. 2A, for example, in a high temperature state (for example, an ambient temperature is 125 degrees Celsius), the phase of the feedback clock signal CLK_fb is ahead of the phase of the reference clock signal CLK_ref. At this time, as shown in FIG. 2B, the controller 130 of the delay locked loop 100 may generate the control code CODE according to the phase comparison information CI, and increase a delay amount provided by the delay line 110 through the control code CODE, so as to generate an adjusted feedback clock signal CLK_fb'. Where, a transition edge of the adjusted feedback clock signal CLK_fb' may be aligned with a transition edge of the reference clock signal CLK_ref to complete a phase locking action.

Figure 2C:
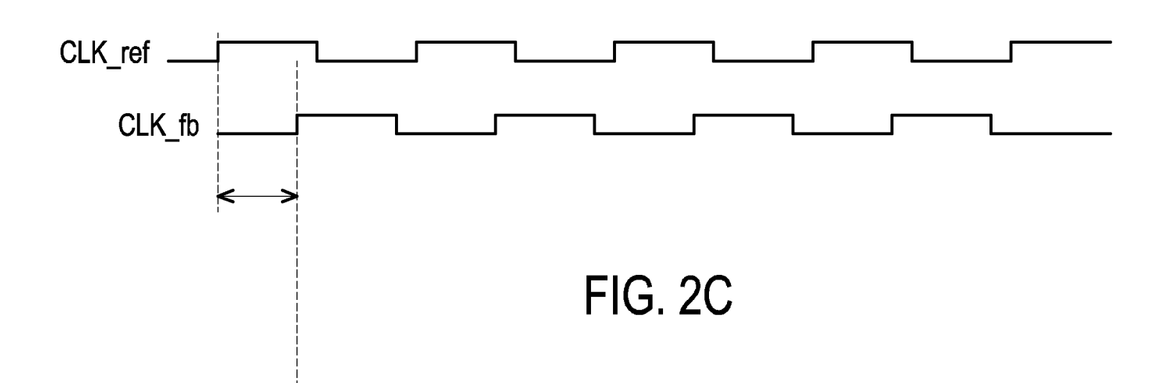
Figure 2D:
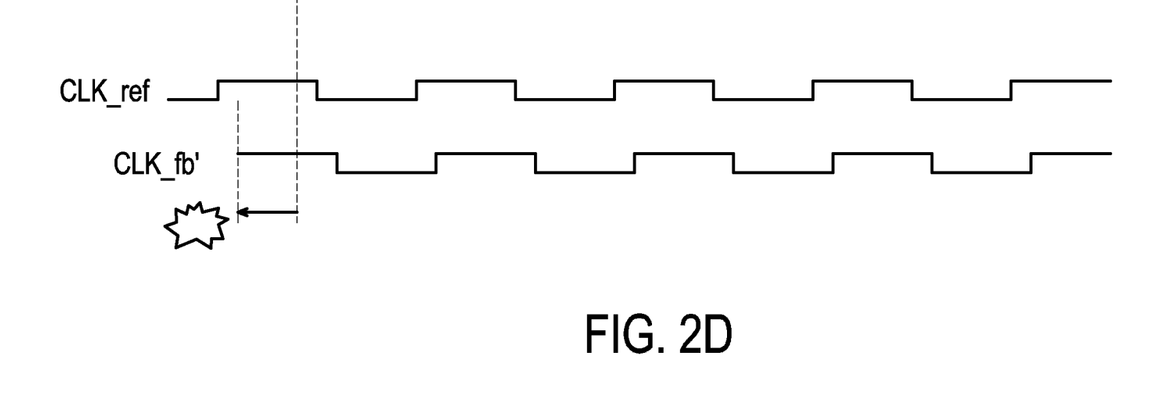
Figure 2E:
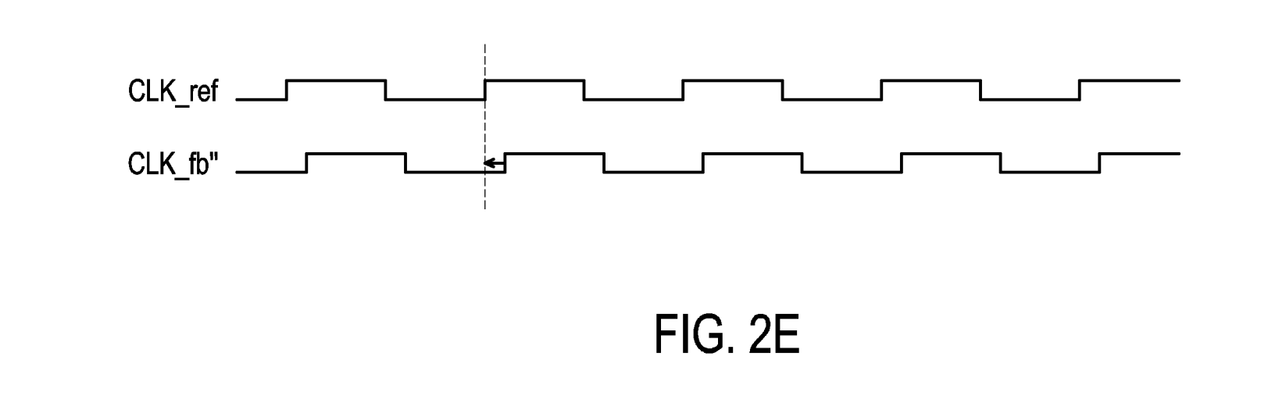
Figure 2F:
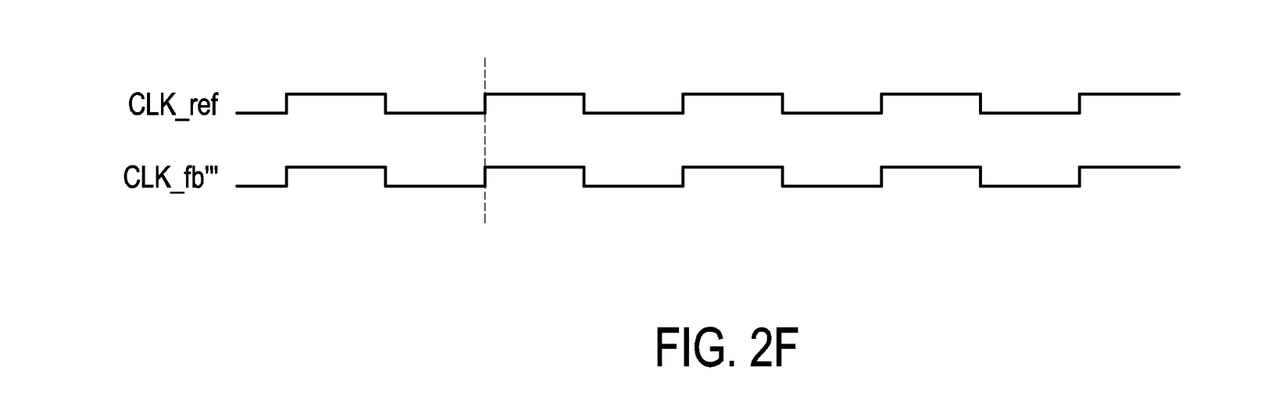

In FIG. 2C, when the ambient temperature is changed to a low-temperature state, such as minus 40 degrees Celsius, the phase of the feedback clock signal CLK_fb may lag behind the phase of the leading reference clock signal CLK_ref to a certain extent. The controller 130 may reduce the delay amount provided by the delay line 110 to the minimum through the control code CODE, and finds that the transition edge of the adjusted feedback clock signal CLK_fb' still cannot be aligned with the transition edge of the reference clock signal CLK_ref (as shown in FIG. 2D). Therefore, in FIG. 2E, through the generated switching signal UF, the controller 130 controls the output clock generator 140 to generate the output clock signal CLK_out by selecting the inverted signal of the delayed clock signal DCLK, and generate a feedback clock signal CLK_fb" inverted to the feedback clock signal CLK_fb'. Then, in FIG. 2F, the controller 130 adjusts the delay amount provided by the delay line 110 by adjusting the generated control code CODE, so that the transition edge of an adjusted feedback clock signal CLK_fb" may be aligned with the transition edge of the reference clock signal CLK_ref, so as to complete the phase locking action.

Figure 3:
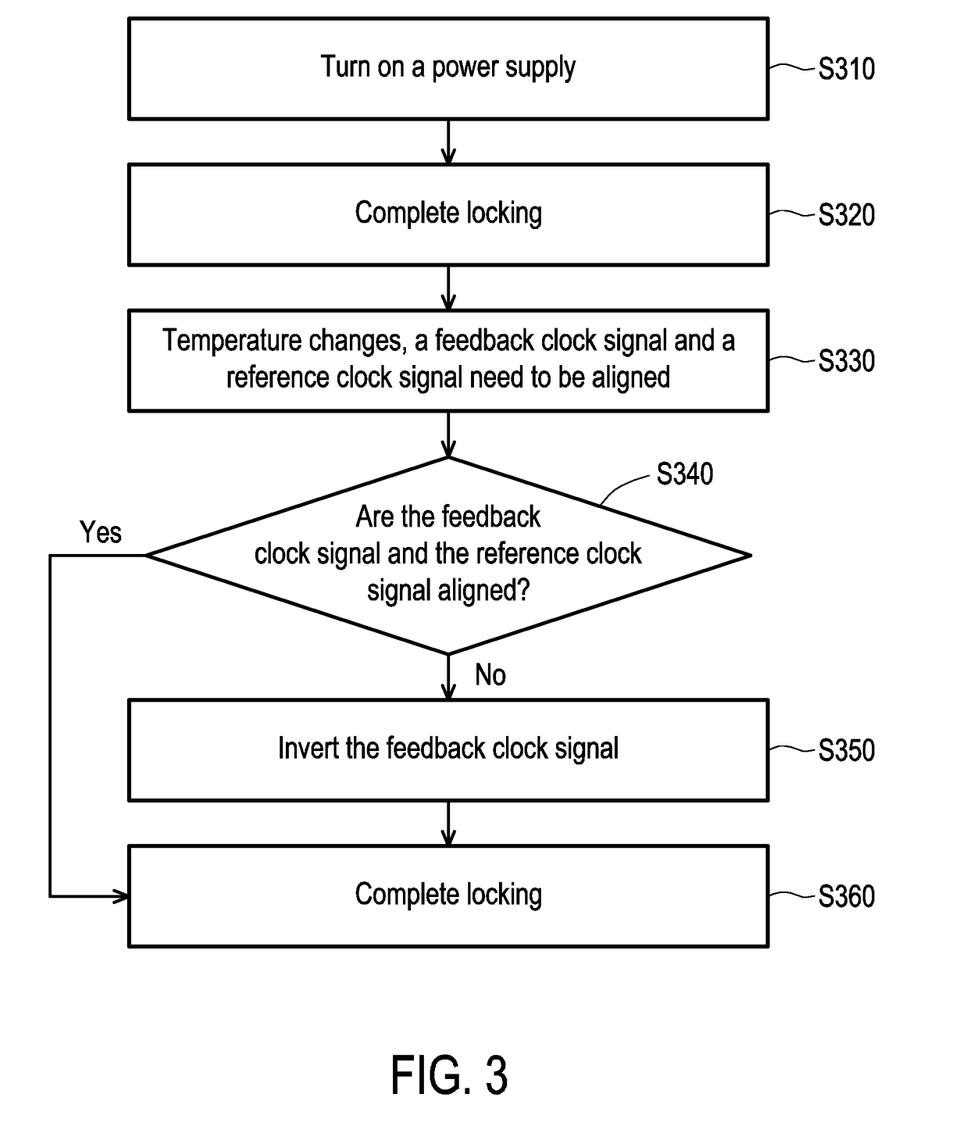
FIG. 3 is a flowchart illustrating an operation flow of a delay locked loop according to an embodiment of the disclosure.

Referring to FIG. 3 below, FIG. 3 is a flowchart illustrating an operation flow of a delay locked loop according to an embodiment of the disclosure. In step S310, the delay locked loop is powered on and starts to perform actions. In step S320, the delay locked loop may complete the phase locking action in a normal state. Then, in step S330, when the ambient temperature changes, the delay locked loop may perform an action of aligning the transition edges of the feedback clock signal and the reference clock signal. In step S340, the delay locked loop determines whether the transition edges of the reference clock signal and the feedback clock signal are aligned, and if a determination result is yes, step S360 may be executed to complete the phase locking action; and if the determination result is no, step S350 may be executed.

In step S350, the delay locked loop may invert the feedback clock signal, and make the transition edges of the inverted feedback clock signal and the reference clock signal to be aligned with each other, so as to complete the phase locking action (step S360).

Figure 4A:
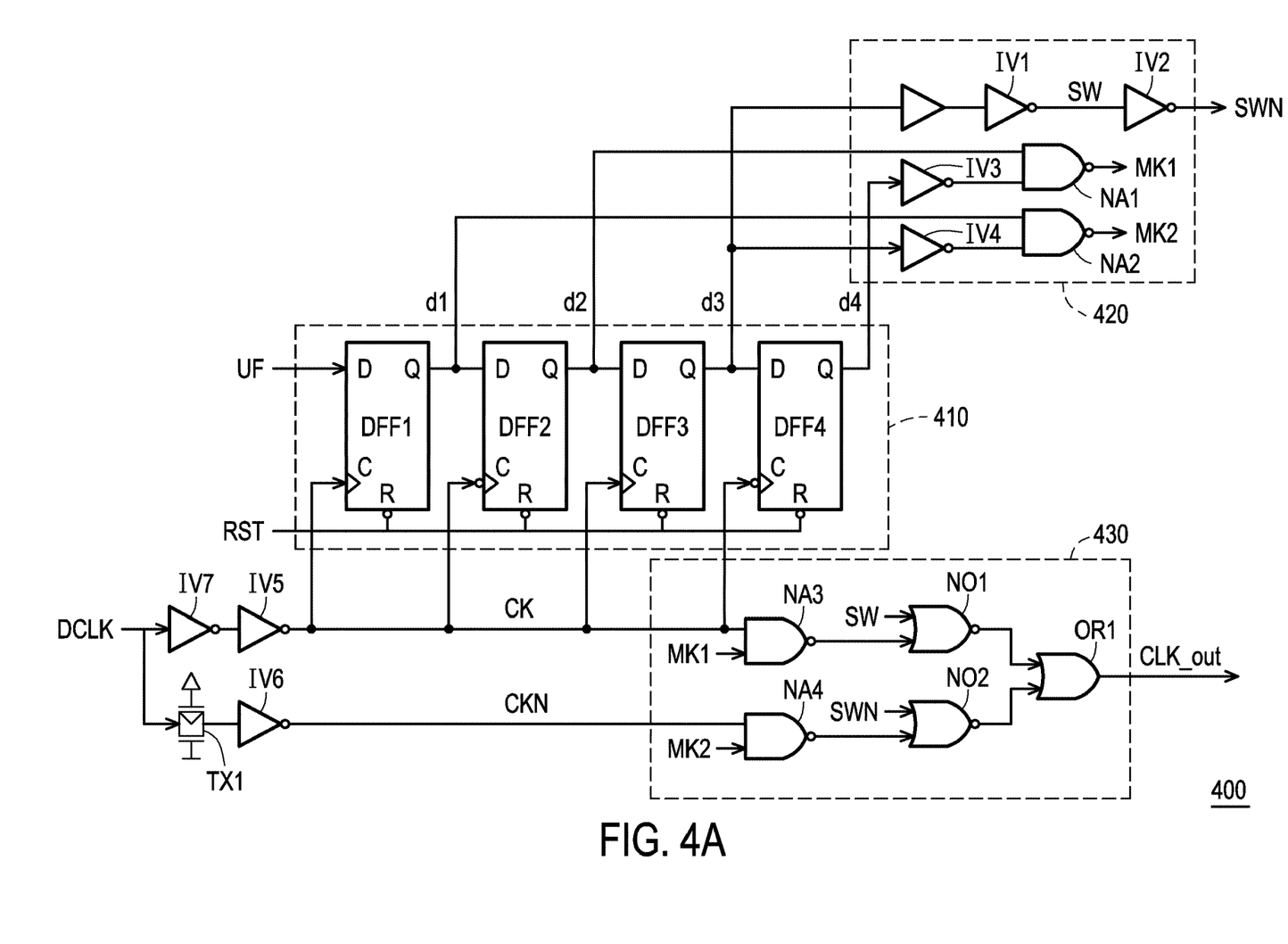
FIG. 4A is a schematic diagram of an implementation of an output clock generator in a delay locked loop according to an embodiment of the disclosure.

Referring to FIG. 4A below, FIG. 4A is a schematic diagram of an implementation of an output clock generator in a delay locked loop according to an embodiment of the disclosure. An output clock generator 400 includes a shift register 410, a logic operator 420 and a signal selector 430. The shift register 410 generates a plurality of shift signals d1 to d4 by shifting the switching signal UF according to the delayed clock signal DCLK. The logic operator 420 is coupled to the shift register 410. The logic operator 420 performs an operation on the shift signals d1 to d4 to generate a plurality of mask signals MK1, MK2 and a plurality of selection signals SW, SWN. The signal selector 430 receives the delayed clock signal DCLK and the inverted signal of the delayed clock signal DCLK. The signal selector 430 selects one of the delayed clock signal DCLK and the inverted signal of the delayed clock signal DCLK according to the mask signals MK1, MK2 and the selection signals SW, SWN to generate the output clock signal CLK_out.

Figure 4B:
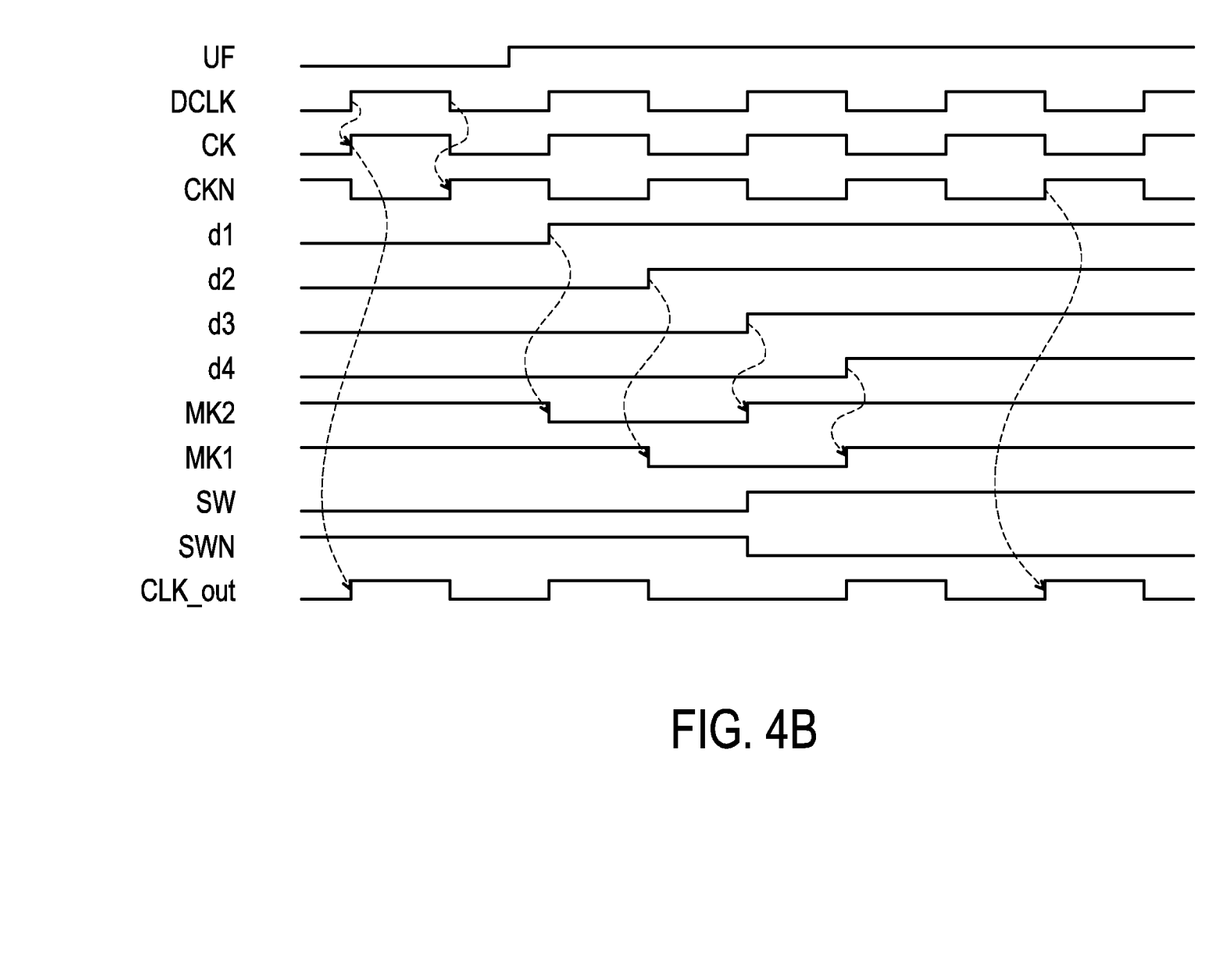
FIG. 4B is a waveform diagram of the output clock generator in the embodiment of FIG. 4A.

Referring to FIG. 4A and FIG. 4B synchronously below, where FIG. 4B is a waveform diagram of the output clock generator in the embodiment of FIG. 4A. The shift register 410 includes a plurality of D-type flip-flops DFF1 to DFF4. A data terminal D of the first-stage D-type flip-flop DFF1 receives the switching signal UF, and data terminals D of the remaining D-type flip-flops DFF2 to DFF4 are coupled to output terminals Q of the previous-stage D-type flip-flops DFF1 to DFF3. Clock terminals C of the D-type flip-flops DFF1 to DFF4 jointly receive a clock signal CK; reset terminals R of the D-type flip-flops DFF1 to DFF4 jointly receives a reset signal RST; and the output terminals Q of the D-type flip-flops DFF1 to DFF4 respectively generate the shift signals d1 to d4.

In addition, the delayed clock signal DCLK is sent to an inverter IV7, and through the inverter IV7 and an inverter IV5 connected in series, the inverter IV5 may generate the clock signal CK substantially having the same phase as the delayed clock signal DCLK. In addition, the delayed clock signal DCLK is transmitted to a transmission gate TX1, and through an inverter IV6, a clock signal CKN inverted to the clock signal CK is generated.

The D-type flip-flops DFF1 to DFF4 may shift the switching signal UF according to the clock signal CK, so as to generate the plurality of shift signals d1 to d4. When the switching signal UF is changed from a logic low level (the second voltage) to a logic high level (the first voltage), the D-type flip-flops DFF1 to DFF4 may shift the switching signal UF and make the shift signals d1 to d4 to be sequentially transited to the logic high level.

The logic operator 420 includes inverters IV1 to IV4 and NAND gates NA1 and NA2. The inverters IV1 and IV2 are connected in series, and respectively generate the selection signals SW and SWN according to the shift signal d3. An input terminal of the NAND gate NA1 receives the shift signal d2, and another input terminal of the NAND gate NA1 is coupled to an output terminal of the inverter IV3, where an input terminal of the inverter IV3 receives the shift signal d4. An output terminal of the NAND gate NA1 is configured to generate the mask signal MK1. When the shift signal d2 is changed to the logic high level (the shift signal d4 remains at the logic high level), the NAND gate NA1 may generate the mask signal MK1 with the logic low level. Thereafter, when the shift signal d4 is changed to the logic high level, the NAND gate NA1 may generate the mask signal MK1 with the logic high level.

In addition, an input terminal of the NAND gate NA2 receives the shift signal d1, and another input terminal of the NAND gate NA2 is coupled to an output terminal of the inverter IV4, where an input terminal of the inverter IV4 receives the shift signal d3. An output terminal of the NAND gate NA2 is configured to generate the mask signal MK2. When the shift signal d1 is changed to the logic high level (the shift signal d3 remains at the logic high level), the NAND gate NA2 may generate the mask signal MK2 with the logic low level. Thereafter, when the shift signal d3 is changed to the logic high level, the NAND gate NA2 may generate the mask signal MK2 with the logic high level.

On the other hand, the signal selector 430 includes NAND gates NA3, NA4, NOR gates NO1, NO2, and an OR gate OR1. An input terminal of the NAND gate NA3 receives the mask signal MK1 and the clock signal CK. When the mask signal MK1 is at the logic low level, the NAND gate NA3 may mask the clock signal CK from being output. An input terminal of the NAND gate NA4 receives the mask signal MK2 and the clock signal CKN. When the mask signal MK2 is at the logic low level, the NAND gate NA4 may mask the clock signal CKN from being output. An input terminal of the NOR gate NO1 receives the selection signal SW, and another input terminal of the NOR gate NO1 receives a first signal generated by the NAND gate NA3. An input terminal of the NOR gate NO2 receives the selection signal SWN, and another input terminal of the NOR gate NO2 receives a second signal generated by the NAND gate NA4. The OR gate OR1 receives a third signal and a fourth signal respectively generated by the NOR gates NO1 and NO2, and the OR gate OR1 generates the output clock signal CLK_out.

When the selection signal SW is at the logic low level, the signal selector 430 may select to output the clock signal CK as the output clock signal CLK_out; on the contrary, when the selection signal SW is at the logic high level, the signal selector 430 may select to output the clock signal CKN as the output clock signal CLK_out. The mask signals MK1 and MK2 are used to mask glitch signals that may be generated during the process of changing and selecting the clock signal CK or the clock signal CKN to generate the output clock signal CLK_out.

Figure 5:
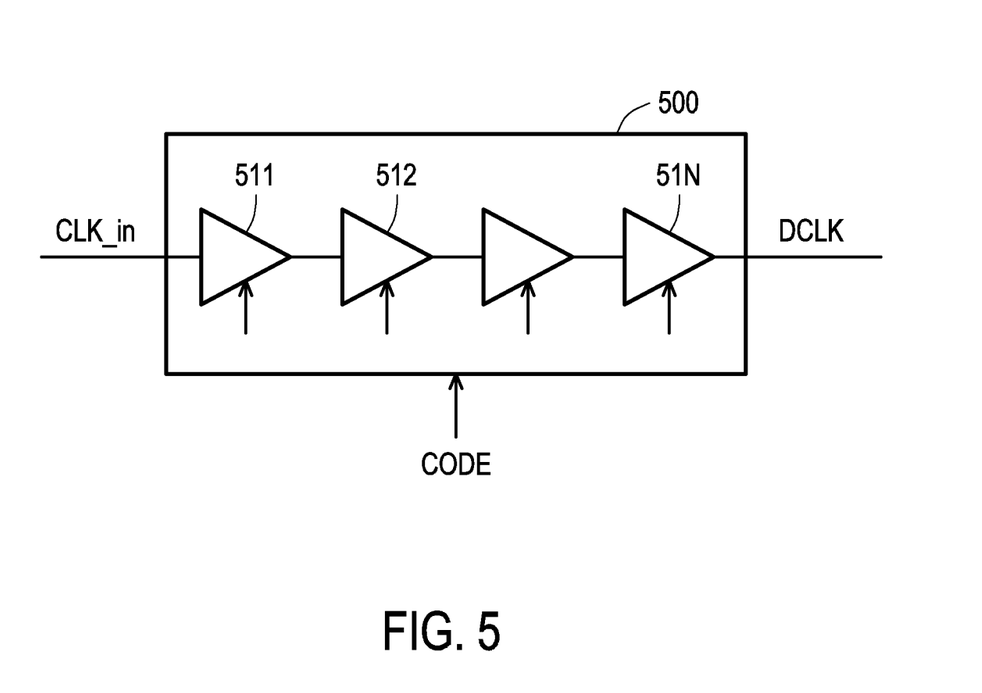
FIG. 5 is a schematic diagram illustrating an implementation of a delay line in a delay locked loop according to an embodiment of the disclosure.

Referring to FIG. 5 below, FIG. 5 is a schematic diagram illustrating an implementation of a delay line in a delay locked loop according to an embodiment of the disclosure. A delay line 500 includes a plurality of unit delay circuits 511 to 51N. The unit delay circuits 511 to 51N are connected in series. The unit delay circuit 511 receives an input clock signal CLK_in. The unit delay circuits 511 to 51N are used to delay the input clock signal CLK_in to generate the delayed clock signal DCLK. Each of the unit delay circuits 511 to 51N may provide a same unit delay amount. In the embodiment, the delay line 500 may receive the control code CODE, and determine the number of the enabled unit delay circuits 511 to 51N according to the control code CODE, so as to adjust the delay amount provided by the delay line 500. When all of the unit delay circuits 511 to 51N are enabled, the delay line 500 may provide a maximum delay amount. When all of the unit delay circuits 511 to 51N are released and not enabled, the delay line 500 may provide a minimum delay amount.

In the embodiment, each of the unit delay circuits 511 to 51N may be implemented by a unit delay circuit known to those skilled in the art without any specific limitation.

Figure 6:
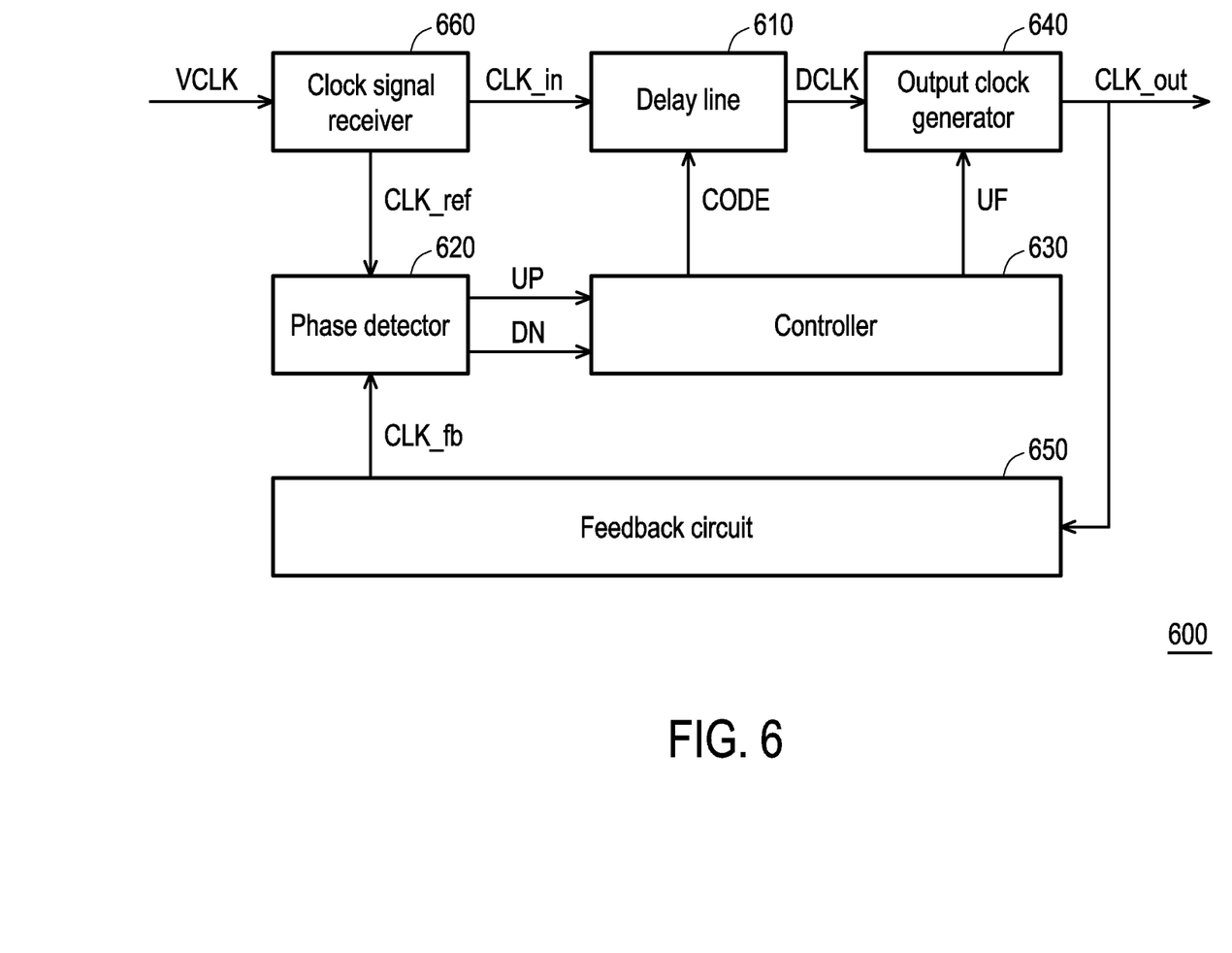
FIG. 6 is a schematic diagram of a delay locked loop according to another embodiment of the disclosure.

Referring to FIG. 6, FIG. 6 is a schematic diagram of a delay locked loop according to another embodiment of the disclosure. A delay locked loop 600 includes a delay line 610, a phase detector 620, a controller 630, an output clock generator 640, a feedback circuit 650 and a clock signal receiver 660. In the embodiment, operation details of the delay line 610, the phase detector 620, the controller 630, the output clock generator 640, and the feedback circuit 650 are the similar to those of the circuit elements with same names in the embodiment of FIG. 1, so that details thereof are not repeated. Different from the previous embodiments, the delay locked loop 600 of the embodiment further includes the clock signal receiver 660. The clock signal receiver 660 is coupled to the delay line 610 and the phase detector 620. The clock signal receiver 660 is configured to receive a source clock signal VCLK, and generate the input clock signal CLK_in and the reference clock signal CLK_ref according to the source clock signal VCLK.

It should be noted that in terms of a hardware framework, in the embodiment, the clock signal receiver 660, the phase detector 620, the controller 630 and the feedback circuit 650 may all be implemented by related hardware circuits (for example, digital circuits) well known to those skilled in the art in the technical field of the delay locked loop, and there is no specific limitation.

In summary, the delay locked loop of the disclosure may effectively execute the locking action through the inverted feedback clock signal when a large ambient temperature change occurs. There is no need to increase a depth of the circuit of the delay line in response to a variation range of the ambient temperature, which may effectively reduce a circuit area and power consumption, and improve working efficiency of the delay locked loop.

What is claimed is:

1. A delay locked loop, comprising:
   a delay line, receiving an input clock signal and a control code, and generating a delayed clock signal by delaying the input clock signal according to the control code;
   a phase detector, receiving a reference clock signal and a feedback clock signal, and detecting a phase difference between the reference clock signal and the feedback clock signal to generate phase comparison information;
   a controller, coupled to the delay line and the phase detector, and generating the control code and a switching signal according to the phase comparison information;
   an output clock generator, coupled to the delay line and the controller, and selecting the delayed clock signal or an inverted signal of the delayed clock signal according to the switching signal to generate an output clock signal; and
   a feedback circuit, coupled to the phase detector and the output clock generator, and generating the feedback clock signal according to the output clock signal.

2. The delay locked loop according to claim 1, wherein the controller sets the switching signal to a first voltage when detecting that a phase of the feedback clock signal lags behind a phase of the reference clock signal by more than a predetermined threshold.

3. The delay locked loop according to claim 2, wherein the output clock generator selects the inverted signal of the delayed clock signal to generate the output clock signal when the switching signal is at the first voltage.

4. The delay locked loop according to claim 3, wherein the output clock generator selects the delayed clock signal to generate the output clock signal when the switching signal is at a second voltage other than the first voltage.

5. The delay locked loop according to claim 1, wherein the output clock generator comprises:
   a shift register, shifting the switching signal according to the delayed clock signal to generate a plurality of shift signals;
   a logic operator, coupled to the shift register, and performing an operation on the shift signals to generate a plurality of mask signals and a plurality of selection signals;
   a signal selector, receiving the delayed clock signal and the inverted signal of the delayed clock signal, and selecting one of the delayed clock signal and the inverted signal of the delayed clock signal according to the mask signals and the selection signals to generate the output clock signal.

6. The delay locked loop according to claim 5, wherein the shift register comprises:
   a plurality of D-type flip-flops, wherein a data terminal of a first-stage D-type flip-flop receives the switching signal, a data terminal of an $i^{th}$ stage D-type flip-flop is coupled to an output terminal of an $(i-1)^{th}$ stage D-type flip-flop, clock terminals of the D-type flip-flops receive the delayed clock signal, and output terminals of the D-type flip-flops respectively generate the shift signals, where i is an integer greater than 1.

7. The delay locked loop according to claim 6, wherein the logic operator performs an NAND operation on a second shift signal generated by an output terminal of a second-stage D-type flip-flop and an inverted signal of a fourth shift signal generated by an output terminal of a fourth-stage D-type flip-flop to generate a first mask signal; the logic operator performs an NAND operation on a first shift signal generated by an output terminal of the first-stage D-type flip-flop and an inverted signal of a third shift signal generated by an output terminal of a third-stage D-type flip-flop to generate a second mask signal; and the logic operator generates a first selection signal and a second selection signal inverted to each other according to the third shift signal.

8. The delay locked loop according to claim 7, wherein the logic operator comprises:
   a first NAND gate, having a first input terminal coupled to the output terminal of the second-stage D-type flip-flop, and a second input terminal coupled to the output terminal of the fourth-stage D-type flip-flop through a first inverter, and the first NAND gate generating the first mask signal;
   a second NAND gate, having a first input terminal coupled to the output terminal of the first-stage D-type flip-flop, and a second input terminal coupled to the output terminal of the third-stage D-type flip-flop through a second inverter, and the second NAND gate generating the second mask signal;
   a third inverter, receiving the third shift signal and generating the first selection signal; and
   a fourth inverter, receives the first selection signal and generating the second selection signal.

9. The delay locked loop according to claim 7, wherein the signal selector determines whether to mask the delayed clock signal according to the first mask signal, determines whether to mask the inverted signal of the delayed clock signal according to the second mask signal, and determines to output the delayed clock signal or the inverted signal of the delayed clock signal according to the first selection signal and the second selection signal to generate the output clock signal.

10. The delay locked loop according to claim 9, wherein signal selector comprises:
    a first NAND gate, receiving the first mask signal and the delayed clock signal and generating a first signal;
    a second NAND gate, receiving the second mask signal and the inverted signal of the delayed clock signal and generating a second signal;
    a first NOR gate, receiving the first selection signal and the first signal, and generating a third signal;
    a second NOR gate, receiving the second selection signal and the second signal, and generating a fourth signal; and
    a third NOR gate, receiving the third signal and the fourth signal, and generating the output clock signal.

11. The delay locked loop according to claim 1, wherein the delay line comprises:

a plurality of unit delay circuits, connected in series, and configured to delay the input clock signal to generate the delayed clock signal, wherein the delay line determines the number of the unit delay circuits to be operated according to the control code.

12. The delay locked loop according to claim 11, wherein the controller sets the switching signal to a first voltage when all of the unit delay circuits are turned off and the phase comparison information indicates that the reference clock signal and the feedback clock signal have a phase difference.

13. The delay locked loop according to claim 1, further comprising:

a clock signal receiver, configured to receive a source clock signal, and providing the input clock signal and the reference clock signal according to the source clock signal.

\* \* \* \* \*

UNITED STATES PATENT AND TRADEMARK OFFICE
CERTIFICATE OF CORRECTION

PATENT NO. : 12,289,113 B2  
APPLICATION NO. : 18/311251  
DATED : April 29, 2025  
INVENTOR(S) : Chi-Hsiang Sun Page 1 of 1

It is certified that error appears in the above-identified patent and that said Letters Patent is hereby corrected as shown below:

On the Title Page

Item (73) Assignee should read: Winbond Electronics Corp., Taichung, (TW)

Signed and Sealed this  
Tenth Day of June, 2025

Coke Morgan Stewart  
*Acting Director of the United States Patent and Trademark Office*